(12) United States Patent
Rogers

(10) Patent No.: US 10,298,193 B2
(45) Date of Patent: May 21, 2019

(54) INTEGRATED MICROELECTROMECHANICAL SYSTEM DEVICES AND METHODS FOR MAKING THE SAME

(71) Applicant: HARRIS CORPORATION, Melbourne, FL (US)

(72) Inventor: John E. Rogers, Gainesville, FL (US)

(73) Assignee: Harris Corporation, Melbourne, FL (US)

( * ) Notice: Subject to any disclaimer, the term of this patent is extended or adjusted under 35 U.S.C. 154(b) by 682 days.

(21) Appl. No.: 14/882,161

(22) Filed: Oct. 13, 2015

(65) Prior Publication Data

US 2016/0036406 A1    Feb. 4, 2016

Related U.S. Application Data

(62) Division of application No. 13/970,120, filed on Aug. 19, 2013, now Pat. No. 9,172,352.

(51) Int. Cl.
*H03H 3/007* (2006.01)
*H03H 9/46* (2006.01)
(Continued)

(52) U.S. Cl.
CPC ......... *H03H 3/0072* (2013.01); *B81B 7/0006* (2013.01); *H03H 3/0073* (2013.01);
(Continued)

(58) Field of Classification Search
CPC .... H03H 3/0072; H03H 3/0073; H03H 9/462; H03H 9/465; H03H 9/505; H03H 9/525; Y10T 29/49016
(Continued)

(56) References Cited

U.S. PATENT DOCUMENTS

| 5,536,988 A | 7/1996 | Zhang et al. |
| 5,959,516 A | 9/1999 | Chang et al. |

(Continued)

FOREIGN PATENT DOCUMENTS

| EP | 1760731 | 3/2007 |
| EP | 1 785 391 A2 | 5/2007 |

(Continued)

OTHER PUBLICATIONS

Tas N.R., et al.: "Technical Note; Design, Fabrication and Test of Laterally Driven Electrostatic Motors Employing Walking Motion and Mechanical Leverage" Journal of Micromechanics & Microengineering, Institute of Physics Publishing, Bristol, GB, vol. 13, No. 1, Jan. 1, 2003 (Jan. 1, 2003), pp. N6-N15, XP020068883.

(Continued)

*Primary Examiner* — Peter Dungba Vo
*Assistant Examiner* — Azm A Parvez
(74) *Attorney, Agent, or Firm* — Fox Rothschild LLP; Robert J. Sacco; Carol E. Thorstad-Forsyth

(57) ABSTRACT

Integrated Microelectromechanical System ("MEMS") devices and methods for making the same. The integrated MEMS device comprises a substrate (200) with first electronic circuitry (206) formed thereon, as well as a MEMS filter device (100). The MEMS filter device has a transition portion (118) configured to (a) electrically connect the MEMS filter device to second electronic circuitry and (b) suspend the MEMS filter device over the substrate such that a gas gap exists between the substrate and the MEMS filter device. The transition portion comprises a three dimensional hollow ground structure (120) in which an elongate center conductor (122) is suspended. The RF MEMS filter device also comprises at least two adjacent electronic elements (102/110) which are electrically isolated from each other via (Continued)

a ground structure of the transition portion, and placed in close proximity to each other.

8 Claims, 10 Drawing Sheets

(51) Int. Cl.

| | |
|---|---|
| *H03H 9/50* | (2006.01) |
| *H03H 9/52* | (2006.01) |
| *B81B 7/00* | (2006.01) |
| *H03H 7/01* | (2006.01) |
| *H03H 7/00* | (2006.01) |

(52) U.S. Cl.
CPC .......... *H03H 7/0115* (2013.01); *H03H 9/462* (2013.01); *H03H 9/465* (2013.01); *H03H 9/505* (2013.01); *H03H 9/525* (2013.01); *H03H 2007/006* (2013.01); *Y10T 29/49016* (2015.01)

(58) Field of Classification Search
USPC .................................................. 29/600, 592.1
See application file for complete search history.

(56) References Cited

U.S. PATENT DOCUMENTS

| | | | |
|---|---|---|---|
| 6,127,767 A | 10/2000 | Lee et al. | |
| 6,133,670 A | 10/2000 | Rodgers et al. | |
| 6,310,526 B1 | 10/2001 | Yip et al. | |
| 6,360,033 B1 | 3/2002 | Lee et al. | |
| 6,497,141 B1 | 12/2002 | Turner et al. | |
| 6,611,168 B1 | 8/2003 | Denison et al. | |
| 6,621,390 B2 | 9/2003 | Song et al. | |
| 6,661,069 B1 | 12/2003 | Chinthakindi et al. | |
| 6,853,534 B2 | 2/2005 | Williams | |
| 6,975,193 B2 | 12/2005 | Knieser et al. | |
| 7,012,489 B2 | 3/2006 | Sherrer et al. | |
| 7,091,647 B2 | 8/2006 | Jerman | |
| 7,148,772 B2 | 12/2006 | Sherrer et al. | |
| 7,251,466 B2 | 7/2007 | Porret et al. | |
| 7,304,556 B2 | 12/2007 | Tamura et al. | |
| 7,598,836 B2 | 10/2009 | Lee | |
| 7,732,975 B1 | 6/2010 | Hobbs et al. | |
| 7,755,174 B2 | 7/2010 | Rollin et al. | |
| 7,858,422 B1 | 12/2010 | Quevy et al. | |
| 7,898,356 B2 | 3/2011 | Sherrer et al. | |
| 7,933,112 B2 | 4/2011 | Ayazi et al. | |
| 7,977,136 B2 | 7/2011 | Ayazi et al. | |
| 8,039,922 B2 | 10/2011 | Ni | |
| 8,276,259 B1 | 10/2012 | Findley et al. | |
| 8,373,522 B2 | 2/2013 | Rogers | |
| 8,860,114 B2 | 10/2014 | Yen et al. | |
| 8,900,994 B2 | 12/2014 | Yu et al. | |
| 9,214,712 B2 | 12/2015 | Cruickshank et al. | |
| 2001/0001550 A1 | 5/2001 | Bryzek et al. | |
| 2002/0130586 A1 | 9/2002 | Mao et al. | |
| 2003/0020561 A1 | 1/2003 | Qiu et al. | |
| 2003/0102936 A1 | 6/2003 | Schaefer | |
| 2003/0155221 A1 | 8/2003 | Kawai | |
| 2003/0184413 A1 | 10/2003 | Nguyen | |
| 2004/0104449 A1 | 6/2004 | Yoon et al. | |
| 2004/0189142 A1 | 9/2004 | Knieser et al. | |
| 2005/0073380 A1 | 4/2005 | Howell et al. | |
| 2005/0088255 A1 | 4/2005 | Sengupta et al. | |
| 2005/0264384 A1 | 12/2005 | Simon et al. | |
| 2006/0003482 A1 | 1/2006 | Chinthakindi et al. | |
| 2006/0087390 A1 | 4/2006 | Yuba et al. | |
| 2006/0238279 A1 | 10/2006 | Lu et al. | |
| 2006/0261702 A1 | 11/2006 | Harada et al. | |
| 2008/0157627 A1 | 7/2008 | Kato et al. | |
| 2009/0058569 A1 | 3/2009 | Sherrer et al. | |
| 2009/0114513 A1 | 5/2009 | Kim et al. | |
| 2010/0091372 A1 | 4/2010 | Yamanoi et al. | |
| 2010/0224872 A1* | 9/2010 | Kimura | H01L 27/1214 257/43 |
| 2011/0102105 A1 | 5/2011 | Rogers | |
| 2011/0148525 A1 | 6/2011 | Herrera | |
| 2011/0188168 A1 | 8/2011 | Rogers | |
| 2011/0198202 A1 | 8/2011 | Rogers | |
| 2011/0204969 A1 | 8/2011 | Chen et al. | |
| 2013/0049888 A1 | 2/2013 | Ruby | |
| 2013/0194770 A1 | 8/2013 | Bernstein et al. | |
| 2013/0285171 A1* | 10/2013 | Najafi | B81B 7/0058 257/415 |
| 2013/0328140 A1 | 12/2013 | Potasek et al. | |
| 2015/0048901 A1 | 2/2015 | Rogers | |
| 2015/0048902 A1 | 2/2015 | Rogers | |
| 2015/0048903 A1 | 2/2015 | Rogers | |

FOREIGN PATENT DOCUMENTS

| | | |
|---|---|---|
| EP | 1973190 | 9/2008 |
| WO | 2000007218 | 2/2000 |
| WO | 2002/080279 | 10/2002 |
| WO | 2003055061 A1 | 7/2003 |
| WO | 2008123525 A1 | 10/2008 |
| WO | 2010054889 A1 | 5/2010 |
| WO | 2011053888 | 5/2011 |
| WO | 2011097093 | 8/2011 |

OTHER PUBLICATIONS

Rogers, John E., et al.: "Bi-Directional Gap Closing MEMS Actuator Using Timing and Control Techniques", IEEE Industrial Electronics, IECON 2006—32nd Annual Conference on, IEEE, Piscataway, NJ, USA, Nov. 1, 2006 (Nov. 1, 2006), pp. 3149-3154, XP031077518.
Harris Corporation, International Search Report dated Mar. 16, 2011; Application Serial No. PCT/US2010/054889.
International Search Report dated Oct. 7, 2011 in Application Serial No. PCT/US2011/022483 in the name of Harris Corporation.
Information about Related Patents and Patent Applications, see section 6 of the accompanying Information Disclosure Statement Letter, which concerns Related Patents and Patent Applications. Dec. 23, 2013.
International Search Report dated Mar. 5, 2012; Application Serial No. PCT/US2011/023321, in the name of Harris Corporation.
Yalcinkaya, A.D., "Low Voltage High-Q SOI MEMS Varactors fro RF Applications"; 2003 IEEE Proceedings of the 29th European Solid-State Circuits Conference, ESSCIRC '03, Sep. 16-18, 2003, pp. 607-610, with one IEEE Xplore abstract page.
Fedder, G.K., "Tunable RF and Analog Circuits Using on-Chip MEMS Passive Components"; 2005 IEEE International Solid-State Circuits Conference, ISSCC 2005, Feb. 9, 2005, Digest of Technical Papers, pp. 390-391.
Information about Related Patents and Patent Applications, see section 6 of the accompanying Information Disclosure Statement Letter, which concerns Related Patents and Patent Applications. (Jan. 28, 2015).
International Search Report and Written Opinion dated Nov. 18, 2014, in Application No. PCT/US2014/049668.
International Search Report and Written Opinion dated Nov. 18, 2014, in Application PCT/US2014/049667.
International Search Report and Written Opinion dated Oct. 31, 2014, in Application PCT/US2014/049664.
Bunch, R.L. et al., "Quality Factor and Inductance in Differential IC Implementations," IEEE Microwave Magazine, vol. 3, No. 2, Jun. 1, 2002, pp. 82-92.
Huang, T. et al., "5-GHz Low Phase-Noise CMOS VCO Integrated with a Micromachined Switchable Differential Inductor," IEEE Microwave and Wireless Components Letters, IEEE Service Center, New York, NY, US, vol. 18, No. 5, May 1, 2008, pp. 338-340.
Leblond, H. et al., "On-Chip Spiral Inductors and Metal-Air-Metal Capacitors in Suspended Technology," 2006 European Microwave Conference, Sep. 1, 2006, pp. 44-47.
Legtenberg, R. et al., "Comb-Driven actuators for Large Displacement," J. of Micromechanics and Microengineering, vol. 6, pp. 320-329.

(56) References Cited

OTHER PUBLICATIONS

Information about Related Patents and Patent Applications, see section 6 of the accompanying Information Disclosure Statement Letter, which concerns Related Patents and Patent Applications. Mar. 10, 2014.
International Search Report and Written Opinion dated Oct. 7, 2011, in Application PCT/US2011/022483.
International Search Report and Written Opinion dated Mar. 5, 2012, in Application PCT/US2011/023321.
Yang, H.Y., "Design Considerations of Differential Inductors in CMOS Technology for RFIC," IEEE Radio Frequency Integrated Circuits Symposium, 0-7803-8333-8/04, copyright 2004 IEEE.
"RF1127 Broadband Low Power SPDT Switch," RFMD.com; Rev. A3 DS090904, retrieved from http://www.rfmd.com/CS/Documents/1127DS.pdf.

* cited by examiner

INTEGRATED MICROELECTROMECHANICAL SYSTEM DEVICES AND METHODS FOR MAKING THE SAME

CROSS-REFERENCE TO RELATED APPLICATION

This application is a divisional application of and claims priority to pending non-provisional U.S. patent application Ser. No. 13/970,120 filed on Aug. 19, 2013, which is hereby incorporated by reference in its entirety.

BACKGROUND OF THE INVENTION

Statement of the Technical Field

The inventive arrangements relate to Microelectromechanical System ("MEMS") and methods for forming the same, and more specifically to transducers with Integrated Circuits ("ICs").

Description of the Related Art

MEMS is a technology of very small devices typically between 2 micrometers to 2 millimeters in size. The MEMS devices can include one or more components between 1 to 100 micrometers in size. Conventional MEMS devices are fabricated using molding techniques, plating techniques, wet etching techniques, dry etching techniques, and/or Electro Discharge Machining ("EDM") techniques. Various materials can be used to create the MEMS devices. Such materials include silicon, polymers, metals and ceramics.

Radio Frequency filters typically occupy a relatively large amount of real estate in an RF system (i.e., >25%). As such, it has been desirable to miniaturize RF filters via MEMS technology, as well as integrate the electronics with the MEMS RF filters as performance can be achieved. In general, there are three techniques for integrating MEMS RF filters with ICs. The three techniques include a pre-processing technique, a post-process technique, and a merged processing technique. The pre-processing technique involves: first fabricating a MEMS device (e.g., MEMS RF filter) on a substrate; isolating the MEMS device using a dielectric layer; and thereafter fabricating the IC. The post-processing technique involves: fabricating the IC on the substrate; isolating the IC using a dielectric layer; and thereafter fabricating the MEMS device. The merged processing technique involves simultaneously fabricating the MEMS device and filter circuitry on a substrate in an interleaving fashion. Typically, the MEMS device is fabricated using a polysilicon material. The ICs are fabricated using thin-film dielectrics and metals (e.g., gold, nickel, aluminum, copper, chromium, titanium, tungsten, platinum and/or silver).

Despite the advantages of integrating RF filters with ICs, the conventional processes for achieving such integration suffer from certain drawbacks. For example, the disposition process of a MEMS device comprising the polysilicon material requires high temperatures (e.g., excess of 1000° C.). The materials that are used to build the ICs have melting points that are much lower (e.g., 300-400° C.) than the temperatures required to fabricate the MEMS devices. Consequently, the ICs may possibly be damaged during the post-processing technique or the merged processing technique as a result. Also, commercially available conventional integrated RF filters exhibit at best an insertion loss of 9 dB, which is considered those skilled in the art as undesirably high. The high insertion loss is primarily due to the use of dielectric films (e.g., Silicon Germanium ("SiGe")) that are inherently lossy at higher frequencies as a result of doping.

SUMMARY OF THE INVENTION

The present invention concerns systems and methods for providing an integrated MEMS device. The MEMS device comprises a substrate, a transition portion, a MEMS filter device, and a gas gap (e.g., an air gap or other dielectric gas gap). The transition portion is coupled to and at least partially extends transversely away from a major surface of the substrate. The MEMS filter device is (a) suspended above or over the major surface of the substrate exclusively by the transition portion, and (b) electrically connected to first electronic circuitry external thereto by the transition portion. The gas gap exists between the major surface of the substrate and the MEMS filter device. Second electronic circuitry can be formed on the major surface of the substrate using a combination of thin-film dielectrics and metals so as to reside on the substrate and isolated from the MEMS filter device. In this scenario, the gas gap exists between the second electronic circuitry and the MEMS filter device. Notably, an isolation between the MEMS filter device and the second electronic circuitry can be greater than forty decibels in certain scenarios.

Notably, the MEMS device can be made using a technique which allows the MEMS filter device to be fabricated without the use of high temperature required to manufacture polysilicon based MEMS devices. The fabrication technique allows the transition portion to be fabricated with a three dimensional hollow ground structure in which an elongated center conductor is suspended. The elongated center conductor can be suspended via a dielectric strap connected between two opposing sidewalls of the transition portion. In other instances, the center conductor may be suspended by anchoring to the substrate or some other dielectric wall. Also, the elongated center conductor is separated from the three dimensional hollow ground structure via an air gap on all sides thereof.

The RF MEMS filter device comprises at least two adjacent electronic elements which are electrically isolated from each other via a ground structure. For example, an electronic element can be electrically isolated from another element via two spaced apart sidewalls of the ground structure. Alternatively, adjacent electronic elements may be electrically isolated from one another on one side via a common sidewall of the ground structure. In this scenario, the common sidewall has a thickness that is at least the thickness of one of the adjoining sidewalls of the ground structure.

BRIEF DESCRIPTION OF THE DRAWINGS

Embodiments will be described with reference to the following drawing figures, in which like numerals represent like items throughout the figures, and in which.

DETAILED DESCRIPTION

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

The present invention generally concerns MEMS devices which are integrated with ICs. The MEMS devices can be used in a variety of applications. Such applications include, but are not limited to, multi-band communication system applications, radar applications, wide-band tracking receiver applications, broadcast radio applications, television applications, and/or wireless communication device applications (e.g., cellphone applications). The MEMS devices include, but are not limited to, RF filters configured to combine and/or separate multiple frequency bands, as well as tunable phase shifters. A schematic illustration of an exemplary RF filter 100 is provided in FIG. 1. In some scenarios, the RF filter 100 comprises a 3-pole tunable bandpass filter designed to select a desired band of frequencies for a particular frequency range (e.g., the 1060-1370 MHz range). Embodiments of the present invention are not limited to 3-pole tunable bandpass filter architectures. The RF filter 100 can include any type of filter architecture suitable for a particular application or have as few or as many poles as necessary for bandwidth. Notably, the tunable feature of the RF filter 100 offers significant size reduction over switch-type RF bandpass filter banks.

Figure 1:
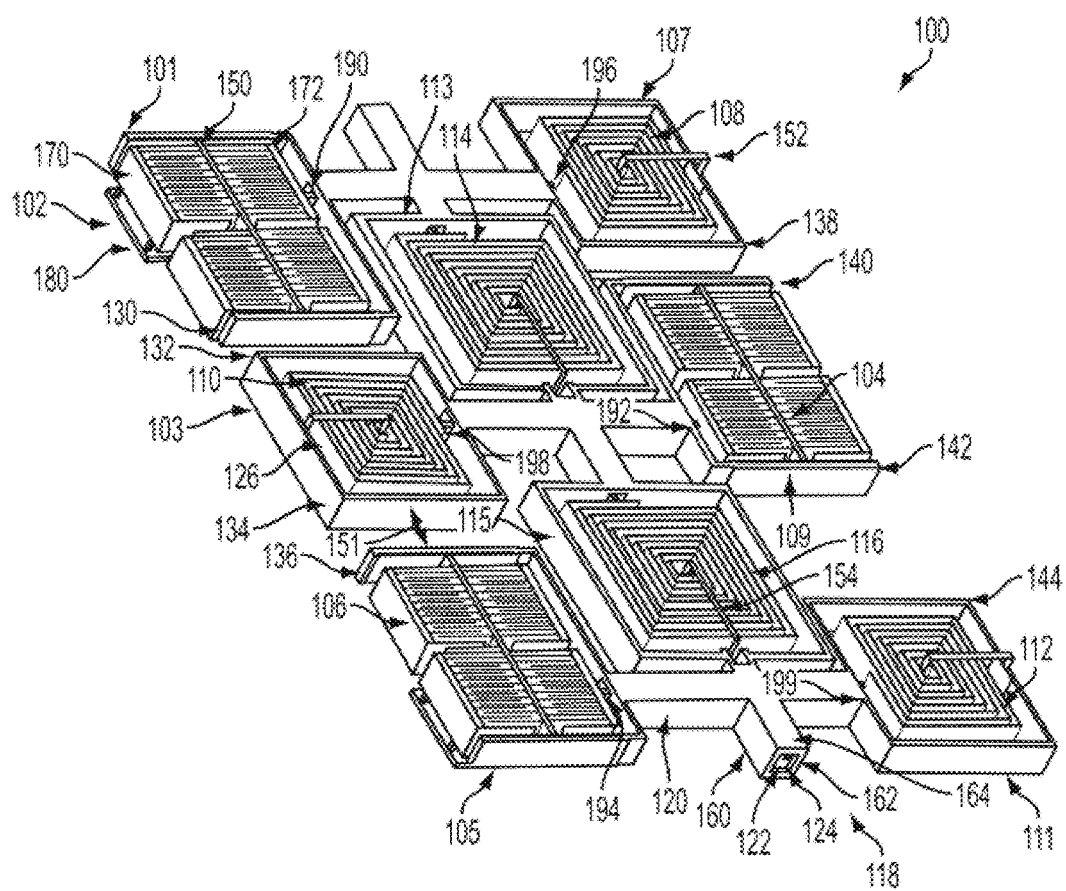
FIG. 1 is a top perspective view of an exemplary MEMS RF filter that is useful for understanding the present invention.

As shown in FIG. 1, the RF filter 100 is implemented using three shunt varactors 102, 104, 106, three shunt inductors 108, 110, 112, two series inductors 114, 116, and a transition portion 118. Each of the listed components 102-116 can be fabricated using at least one conductive material, such as metal (e.g., gold, nickel, aluminum, copper, chromium, titanium, tungsten, platinum, and/or silver). Inductors are well known in the art, and therefore will not be described in detail herein. However, an exemplary shunt varactor will be described below in relation to FIG. 3. Notably, the RF filter 100 exhibits a 1.9 dB insertion loss across a 300 MHz bandwidth. This is a significant insertion loss improvement over conventional RF filter designs, such as those described above in the background section of the document.

The transition portion 118 is configured to electrically connect the RF filter 100 to external circuitry. Accordingly, the transition portion 118 comprises a ground structure 120 and a center conductor 122. The center conductor 122 is electrically connected to the shunt varactors 102, 104, 106 at points 190, 192, 194, inductors 108, 110, 112 at ends 196, 198, 199, and inductors 114, 116 at their outer ends and center ends. Conductive structures 154 are provided to facilitate the electrical connection of the center conductor 122 to the center ends of the inductors 114, 116. Similarly, the ground structure 120 provides electrical coupling to the shunt varactors 102, 104, 106 via grounding portions 150 and inductors 108, 110, 112 via grounding portions 152.

Operation of inductors are well known in the art, and therefore will not be described herein. Operation of the shunt varactors 102, 104, 106 will be described below in relation to FIGS. 3-4. Still, it should be understood that each shunt varactor 102, 104, 106 comprises interdigitated drive comb structures and a truss comb structure. A voltage (e.g., 90 Volts) is applied to the drive comb structures via the center conductor 122 such that a gap between each drive comb structure and the truss comb structure is varied. For example, in some scenarios, the gap between respective comb structures is varied between 20 microns down to 5 microns. Notably, the drive comb structures 170, 172 of each shunt varactor 102, 104, 106 are electrically connected to each other via a respective structure 180.

As shown in FIG. 1, the ground structure 120 comprises a plurality of straight portions defined by a three dimensional hollow structure with a generally rectangular cross-sectional profile. The center conductor 122 is disposed within the three dimensional hollow structure. In some scenarios, the center conductor 122 is suspended therein so as to extend along a center axis of each straight portion of the ground structure 120. Accordingly, the center conductor 122 is encompassed by the ground structure 120 along at least a portion of its length and separated from the ground structure 120 via an air gap 124 on all sides thereof. The center conductor 122 and ground structure 120 are fabricated using at least one conductive material, such as metal (e.g., gold, nickel, aluminum, copper, chromium, titanium, tungsten, platinum, and/or silver).

In some scenarios, the center conductor 122 is suspended within the ground structure 120 via one or more dielectric straps (not shown in FIG. 1) connected between opposing sidewalls of the ground structure 120. For example, a dielectric strap can be connected between sidewalls 160, 162 of the ground structure 120 so as to mechanically support and/or suspend at least a portion of the center conductor 122 disposed within section 164 of the ground structure 120. In some scenarios, a plurality of dielectric straps is disposed along the entire length of each straight portion of the ground structure 120.

The ground structure 120 also comprises isolation portions 101, 103, 105, 107, 109, 111, 113, 115 each defined by a plurality of sidewalls (e.g., two, three or four sidewalls). Each isolation portion 101, 103, 105, 107, 109, 111, 113, 115 at least partially surrounds a respective component 102, 104, 106, 108, 110, 112, 114, 116 so as to electrically isolate the same from other adjacent components. For example, as shown in FIG. 1, the ground structure 120 surrounds four sidewalls of each inductor 108-116. The ground structure 120 also surrounds three sidewalls of each shunt varactor 102-106. Embodiments of the present invention are not limited in this regard. Alternatively, the ground structure 120 can surround one or more sidewalls of one or more inductors 108-116 and/or shunt varactors 102-106.

In some scenarios, a space 151 is provided between adjacent sidewalls 130/132, 134/136, 138/140, 142/144 of the ground structure 120. Notably, the space 151 has dimensions selected for ensuring that adjacent electronic components are placed in close proximity to each other. For example, in some scenarios, the adjacent sidewalls 130/132, 134/136, 138/140, 142/144 are spaced 0.1-1.0 mm from each other. In other scenarios, no space 151 is provided between adjacent sidewalls 130/132, 134/136, 138/140, 142/144. Alternatively a single sidewall of the ground structure 120 (or a "common sidewall") is used to separate two adjacent components 102/110, 102/114, 104/112, 104/114, 104/116, 106/116, 108/104, 108/114, 110/106, 110/114, 110/116, 112/116. In this case, the single sidewall has a thickness that is the same as or greater than that of one adjoining sidewall of the ground structure 120. The other adjoining sidewalls include, but are not limited to, a sidewall of the ground structure to which the common sidewall is adjacent and directly connected.

In some scenarios, the RF filter 100 has an overall size of 3.6 mm by 4.8 mm. Accordingly, each shunt varactor 102, 104, 106 has a size of 1.1 mm by 1.4 mm. Each shunt inductor 108, 110, 112 has a size of 1.1 mm by 1.1 mm. Embodiments of the present invention are not limited to the particularities of such scenarios. However, it should be reiterated that such an RF filer architecture exhibits a 1.9 dB insertion loss across a 300 MHz bandwidth. This is a significant insertion loss improvement over conventional RF filter designs, such as those described above in the background section of the document.

Notably, the RF filter 100 can be fabricated using a process which allows the RF filter 100 to be fabricated without the use of the high temperature required to fabricate conventional polysilicon based MEMS devices. In some scenarios, the metal material used to fabricate the RF filter 100 and the metal material used to fabricate an IC have melting points that are the same (e.g., ≤100° C.) or that have no more than a 100° C. difference. Embodiments of the present invention are not limited to the melting point particularities of these scenarios. An exemplary fabrication process will be described below in relation to FIGS. 5A-5Z.

Figure 2:
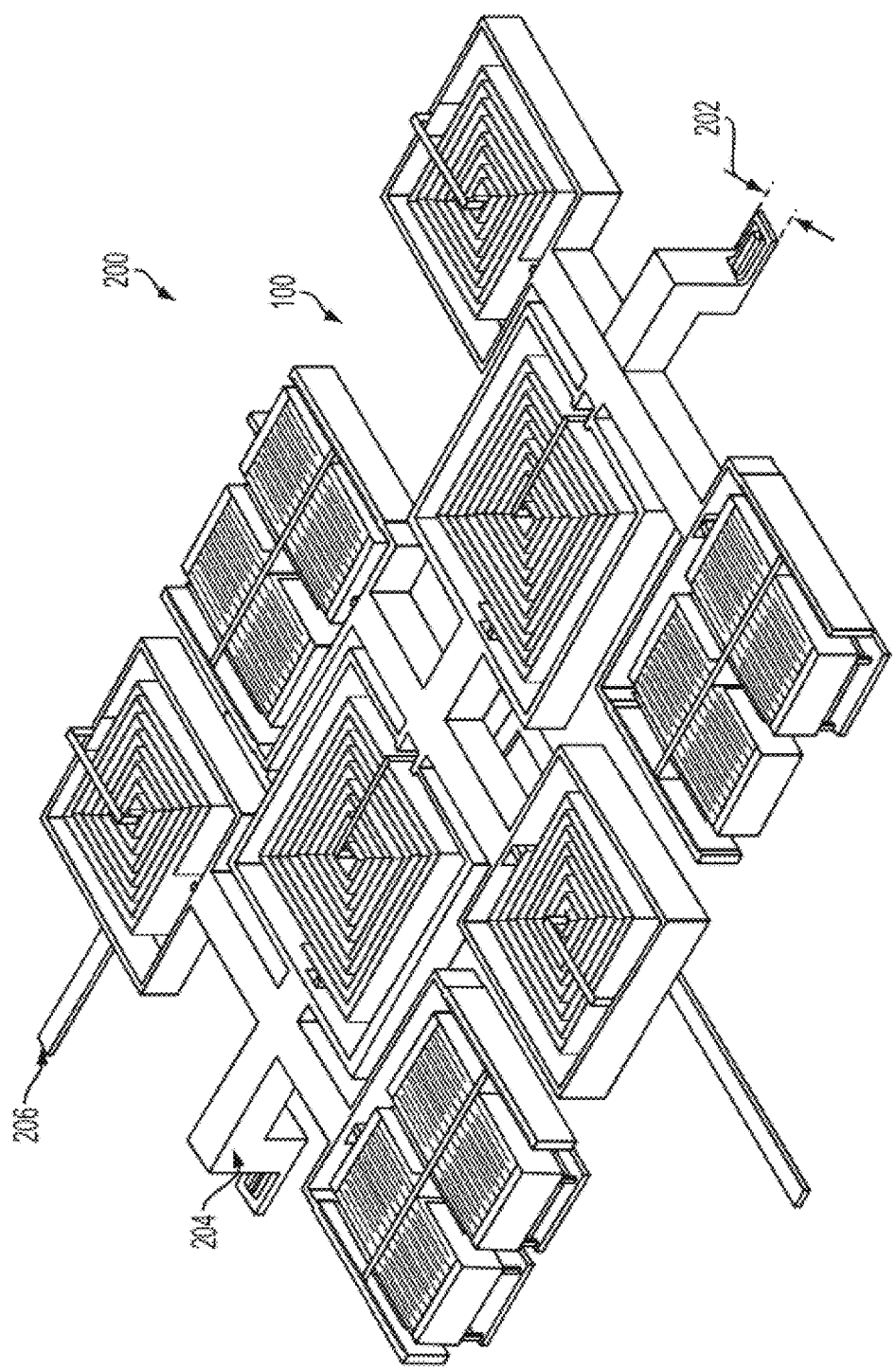
FIG. 2 is a top perspective view of an exemplary MEMS RF filter fabricated on a substrate that is useful for understanding the present invention.

The fabrication process also allows the RF filter 100 to be fabricated so as to be suspended above a substrate 200, as shown in FIG. 2. Substrate 200 can include, but is not limited to, a flat semiconductor wafer. In this regard, a gas gap 202 is provided between the RF filter 100 and the substrate 200. The gas can include, but is not limited to, air or a dielectric gas. Also, the transition portion 118 has a dual purpose. Specifically, the transition portion 118 has a dual purpose of (1) electrically connecting the RF filter 100 to external circuitry and (2) mechanically supporting the RF filter 100 structure as its suspended position above the substrate 200. The support is achieved by including a support structure 204 at each end of the transition portion 118. In some scenarios, the support structure 204 has a generally S-like shape with a first portion connected to the substrate, a second portion extending out and away from the first portion, and a third portion extending along with the first portion, as shown in FIG. 2. In other scenarios, the support structure 204 simply comprises a vertical straight post-like shape. A person skilled in the art would understand that other architectures for the support structure 204 can be used herein to suspend the RF filter 100 above a substrate. Notably, the RF filter 100 is suspended over the substrate 200 exclusively by the transition portion. This arrangement provides certain advantages in the manufacture of the integrated RF filter 100, as well as an improvement in the quality of the RF filter 100 by avoiding use of additional dielectric materials (other than air) as additional mechanical supports.

By suspending the RF filter 100 above the substrate 200, valuable space on the surface of the substrate 200 is made available for other circuitry 206, thereby providing a more compact MEMS device as compared to conventional MEMS devices including RF filters. Notably, there is relatively minimal coupling (cross talk) of a signal traveling through the filter onto circuitry 206 formed below on the substrate 200. For example, in some scenarios, the isolation is greater than 40 dB across 6 GHz.

Figure 3:
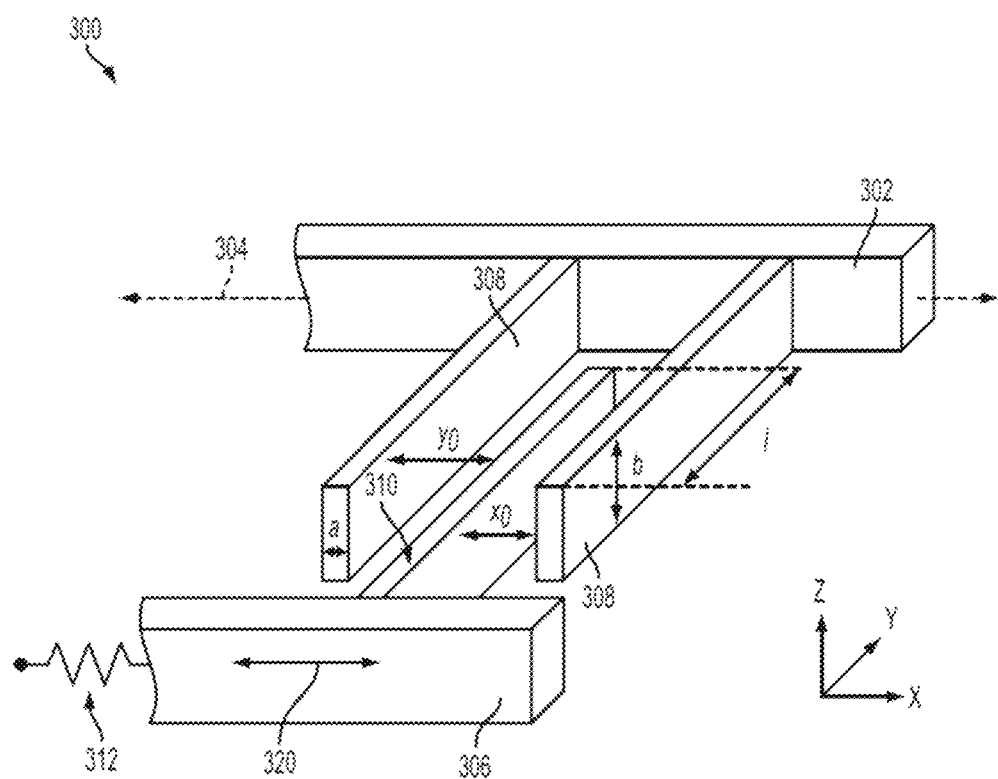
FIG. 3 is a schematic illustration of an exemplary architecture for a MEMS shunt varactor that is useful for understanding the present invention.

Referring now to FIG. 3, there is provided a schematic illustration of an exemplary architecture for a drive portion 300 of a shunt varactor. Each of the shunt varactors 102, 104, 106 of FIG. 1 can have a drive portion that is the same as or similar to that of FIG. 3. Drive portion 300 includes a drive comb structure 302 having a fixed position and extending along a longitudinal axis 304. Drive portion 300 also includes a truss comb structure 306 that extends substantially parallel to axis 304 and that can elastically move in the X direction along a motion axis 320 substantially parallel to axis 304 of the drive comb structure 302. For example, as shown in FIG. 3, truss comb structure 306 can include or be attached to at least one restorative or resilient component 112 connected to a fixed end. The resilient component 112 restores a position of truss comb structure 306 when no external forces are being applied. The drive comb structure 302 can have one or more drive fingers 308 extending therefrom towards truss comb structure 306. The truss comb structure 306 can similarly include one or more truss fingers 310 extending therefrom towards the drive comb structure 302.

As shown in FIG. 3, the drive comb structure 302 and the truss comb structure 306 can be positioned to be interdigitating. The term "interdigitating", as used herein with respect to comb structures, refers to arranging comb structures such that the fingers extending from such comb structures at least partially overlap and are substantially parallel.

In the exemplary architecture of FIG. 3, fingers 308 and 310 can each have a width and a height of a and b, respectively, and an overlap length of l. Although comb structures with multiple sets of fingers can be configured to have the same dimensional relationships (width, height, and overlap), the present invention is not limited in this regard and dimensional relationships can vary, even within a single shunt varactor. Furthermore, the portion shown in FIG. 3 and the dimensional relationship shown in FIG. 3 are only the electrically conductive portions of drive portion 300. As one of ordinary skill in the art will recognize, comb structures can further include structural portions comprising non-conductive or semi-conductive materials extending in the Z direction to provide structural support for the conductive portions shown in FIG. 3.

The drive portion 300 shown in FIG. 3 operates on the principle of electrostatic attraction between adjacent interdigitating fingers. That is, motion of the truss comb structure 306 can be generated by developing a voltage difference between the drive comb structure 302 and the truss comb structure 306. In the case of drive portion 300, the voltages applied at comb structures 302, 306 are also seen at fingers 308, 310, respectively. The resulting voltage difference generates an attractive force between fingers 308 and 310. If the generated electrostatic force between fingers 308 and 310 is sufficiently large to overcome the other forces operating on truss comb structure 306 (such as a spring constant of resilient component 312), the electrostatic force will cause the motion of the truss comb structure 306 between a first interdigitated position (resting position at a zero voltage difference) and a second interdigitated position (position at a non-zero voltage difference) among motion axis 320. Once the voltage difference is reduced to zero, resilient component 312 restores the position of truss comb structure 306 to the first interdigitating position.

As shown in FIG. 3, each finger 310 in truss comb structure 306 can be disposed between two fingers 308 of drive comb structure 302. Accordingly, an electrostatic force is generated on both sides of finger 310 when a voltage difference is developed between comb structures 302 and 306. Therefore, to ensure movement of truss comb structure 306 in only one direction in response to a voltage difference, fingers 310 are positioned with respect to fingers 308 such that the electrostatic force in a first direction along the X-axis is greater than the electrostatic force in an opposite direction in the X-axis. This is accomplished by configuring the finger spacing (i.e., spacing between fingers of interdigitated comb structures) in the first direction along the X-axis ($x_0$) and the finger spacing in the opposite direction along the X-axis ($y_0$) to be different when the voltage difference is zero. Since the amount of electrostatic force is inversely proportional to the distance between fingers, the motion of truss comb structure will be in the direction associated with the smaller of $x_0$ and $y_0$.

The drive portion 300 provides a control mechanism for horizontal actuation in a shunt varactor that can be precisely controlled by adjusting the voltage difference between the drive and truss comb structures. This allows continuous adjustment over a range of interdigitating positions (by adjusting the voltage continuously over a voltage range).

Although the drive portion described above could be coupled to any variety of devices, using such a drive portion for various types of devices will only provide a partial improvement in manufacturing robustness and device reliability. In general, the robustness of the IC fabrication techniques used for fabricating MEMS devices and other types of devices is increased by reducing the variety of feature types and dimensional variation in each layer. The present invention exploits this characteristic. In particular, another aspect of the invention is to use the comb structure drive portion in conjunction with a comb structure based varactor portion, as shown below in FIG. 4.

Figure 4:
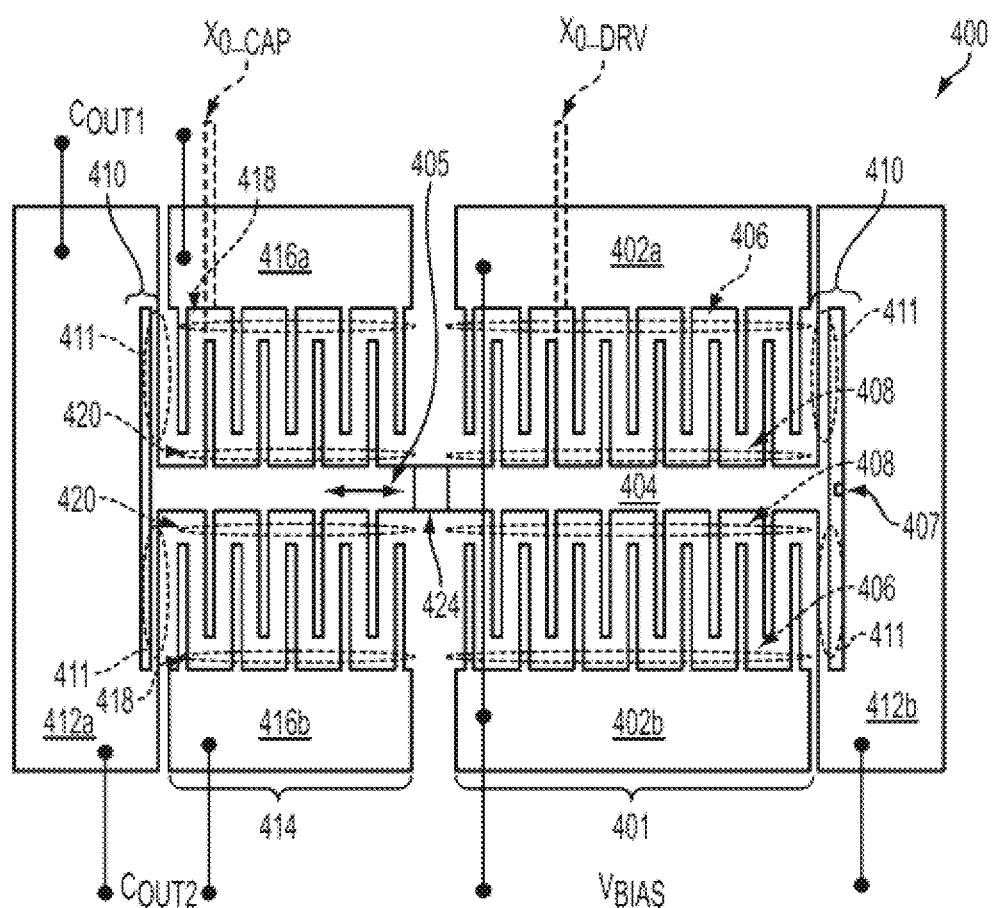
FIG. 4 is a top-down view of an exemplary MEMS shunt varactor that is useful for understanding the present invention.

FIG. 4 shows a top-down view of an exemplary MEMS shunt varactor 400 that is useful for understanding the present invention. Each of the shunt varactors 102, 104, 106 of FIG. 1 can be the same as or similar to the MEMS shunt varactor 400 of FIG. 4. As shown in FIG. 4, varactor 400 includes a drive portion 401, similar to the drive portion 300 described above in relation to FIG. 3. That is, drive portion 401 includes drive comb structures 402a and 402b (collectively 402), a truss comb structure 404, drive fingers 406, and truss fingers 408.

Truss comb structure 404 also includes resilient portions 410 with fixed ends 412a and 412b (collectively 412). Resilient portions 410 comprise resilient or flexible reed structures 411 mechanically coupling truss comb structure 404 to fixed ends 412. Therefore, a leaf spring structure is effectively formed on the two ends of truss comb structure. In operation, as a force is exerted on truss comb structure 404 (by generating a voltage difference between fingers 406 and 408) the reed structures 411 deform to allow truss comb structure to move along motion axis 405 from a first interdigitated position to at least a second interdigitated position. Once the force is no longer being exerted, the reed structures 411 apply a restorative force to restore the position of the truss comb structure 404 to a first interdigitated position. The operation and configuration of components 402-410 is substantially similar to that of components 302, 306, 308, 310, 312 of FIG. 3. Therefore, the discussion of FIG. 3 is sufficient for describing the operation and configuration for components 402-410 of FIG. 4. As described above, in addition to the drive portion 401, varactor 400 also includes a variable capacitor or varactor portion 414, as shown in FIG. 4. The varactor portion 414 includes input/output comb structures 416a and 416b (collectively 416) having a fixed position. The input/output comb structures 416 can also have one or more sense fingers 418 extending therefrom. Within the varactor portion 414 of varactor 400, the truss comb structure 404 can additionally include one or more additional truss fingers 420 extending therefrom and interdigitating sense fingers 418. Therefore, the truss comb structure 404 interdigitates (via fingers 408 and fingers 420) both the drive fingers 406 and the sense fingers 418. As a result, the truss comb structure 404 mechanically connects and is part of both the drive portion 401 and the varactor portion 414.

Fingers 406, 408, 418 and 420 are shown to be similarly dimensioned and having a same amount of overlap. However, the invention is not limited in this regard and dimensional relationships can be different in the drive portion 401 and varactor portion 414. Furthermore, the dimensional relationship can also vary within the varactor portion 414. Additionally, as described above with respect to FIG. 3, the comb structures 402, 404 and 416 can further include conductive portions and structural portions, comprising non-conductive or semi-conductive materials, to provide structure support for the conductive portions.

As described above, varactor 400 is configured to provide functionality as a variable capacitor or varactor. In particular, the truss comb structure 404 is configured to provide an adjustable capacitance based on adjustment of the gap between the first capacitor plate, provided by fingers 418, and a second capacitor plate, provided by fingers 420. Therefore, varactor 400 forms a first adjustable capacitor or varactor between truss comb structure 416a and truss comb structure 404, with a capacitance of $C_{OUT1}$, and a second adjustable capacitor or varactor between comb structure 416b and truss comb structure 404, with a capacitance of $C_{OUT2}$.

These first and second varactors can be used separately or in combination. In combination, these varactors can be connected to provide capacitance in series or parallel. For example, to provide a series capacitance, the capacitance can be measured between comb structures 416a and 416b. In contrast to provide a parallel capacitance, the capacitance can be measured between comb structures 416a, 416b and fixed end 412a (if electrically coupled to fingers 420).

In some scenarios, a discontinuity 424 is provided to isolate fingers 420 from fingers 408. As described above, the discontinuity 424 can be provided to reduce any interference between the varactor portion 414 and the drive portion 401. For example, to prevent the charge stored between fingers 418 and 420 from affecting a voltage difference between fingers 406 and 408 and vice versa. However, if fixed ends 412a and 412b are both coupled to ground, isolation between drive portion 401 and varactor portion 414 is maintained without requiring such discontinuity 424.

Varactor 400 operates as follows. A circuit (not shown) is connected to comb structures 416a, 416b, and fixed end 412a (if necessary, as described above). To increase amount of capacitance at $C_{OUT1}$ and $C_{OUT2}$, a voltage difference ($V_{BIAS}$) is developed between fingers 406 and 408 to generate electrostatic attraction between these fingers. For example, $V_{BIAS}$ is applied across drive comb structures 402 and fixed ends 412b (which is electrically coupled to fingers 408) to cause sufficient electrostatic attraction between fingers 406 and 408 to induce motion of truss comb structure 404, and consequently motion of fingers 420 towards fingers 418, reducing a spacing $X_{0\_CAP}$ between fingers 418 and 420. Consequently, the changing of the spacing between the capacitor plates results in a different capacitance value for both $C_{OUT1}$ and $C_{OUT2}$. Therefore, to increase capacitance, $V_{BIAS}$ is selected to create an electrostatic force that is at least greater than the restorative force of reed structures 411 to cause motion of truss comb structure 404 along motion axis 405. Afterwards, to decrease the capacitance, $V_{BIAS}$ is reduces such that the electrostatic force is less than the restoring force applied by reed structures 411. The restoring force then acts on truss comb structure 404 to increase the gap between fingers 420 and fingers 418, and thus lower the capacitance.

Figure 5A:
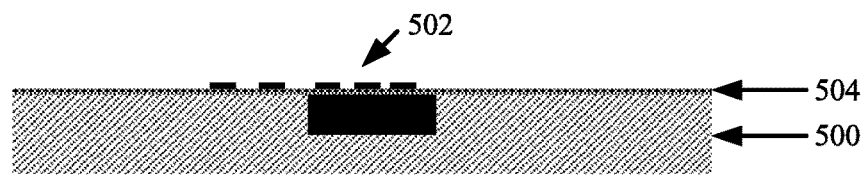
FIGS. 5A-5Z show partial cross-sections of a MEMS device during various steps of a fabrication process in accordance with embodiments of the present invention.

The RF filter structure described above can be fabricated using a MEMS fabrication technique. This is illustrated in FIGS. 5A-5Z. FIGS. 5A-5Z show partial cross-sections of a MEMS device (e.g., the MEMS device shown in FIG. 2) during various steps of a fabrication process in accordance with embodiments of the present invention.

Manufacture of the MEMS device begins with the formation of an interface layer 502 on a substrate 500. An isolation layer 504 may also exist on the substrate 500. After the formation of the interface layer 502, various steps are performed to fabricate an RF filter that is suspended there above. These steps are described below in relation to FIGS. 5B-5Z.

Figure 5B:
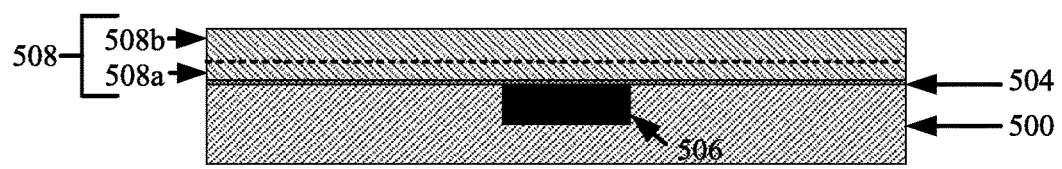
Figure 5C:
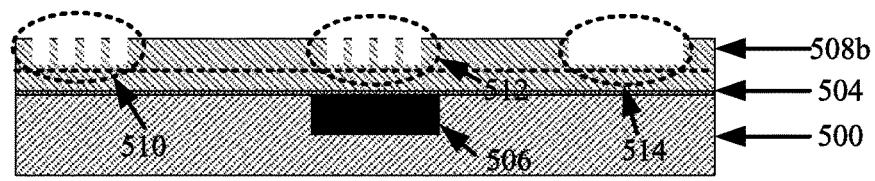
Figure 5D:
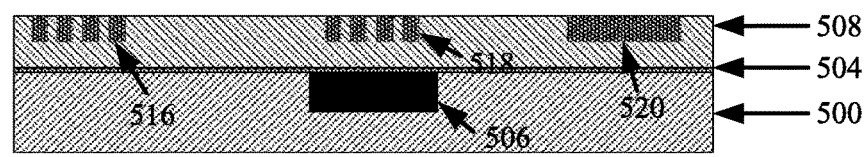

As shown in FIG. 5B, a first and second resist layers 508a and 508b (collectively 508) are disposed on the top surface of the substrate 500 so as to cover the circuitry 506. Next, the second resist layer 508b is patterned to form at least partially the shunt varactors (e.g., a shunt varactor 102, 104 and/or 106 of FIG. 1), inductors (e.g., inductor 108, 110, 112, 114 and/or 116 of FIG. 1), and a transition portion (e.g., transition portion 118 of FIG. 1) of the RF filter (e.g., RF filter 100 of FIG. 1). A schematic illustration of second resist layer 508b which has been patterned is provided in FIG. 5C. As shown in FIG. 5C, at least three patterns have been formed in the second resist layer 508b. A first pattern 510 is provided for forming a lower portion of a comb structure of a shunt varactor. Pattern 512 is provided for forming a lower portion of an inductor coil. Pattern 514 is provided for forming a lower portion of a transition portion. Therefore, each pattern 510, 512, 514 is then filled with a conductive material 516-520, as shown in FIG. 5D.

Figure 5E:
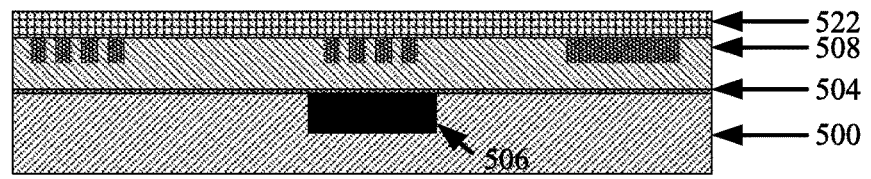
Figure 5F:
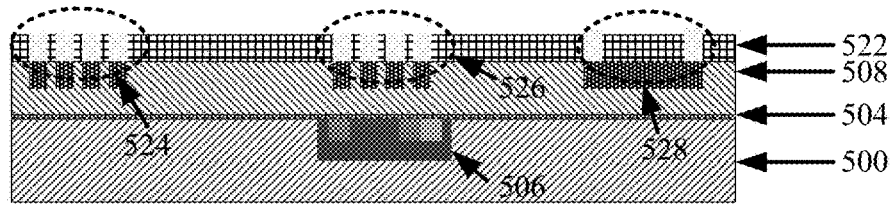
Figure 5G:
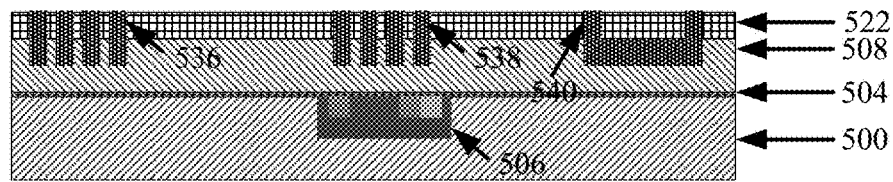

In FIG. 5E, a third resist layer 522 is disposed over the first and second resist layers 508 and conductive material 516-520. The third resist layer 522 is then patterned in FIG. 5F for forming at least a portion of a middle section of the comb structure, inductor coil, and transition portion. As such, three patterns 524-528 are formed in the third resist layer 522. Pattern 524 is provided for forming a portion of middle section of the comb structure of the shunt varactor. Pattern 526 is provided for forming a portion of a middle section of an inductor coil. Pattern 528 is provided for forming a portion of a middle section of a transition portion. Therefore, each pattern 530, 532, 534 is then filled with the conductive material 536-540, as shown in FIG. 5G.

Figure 5H:
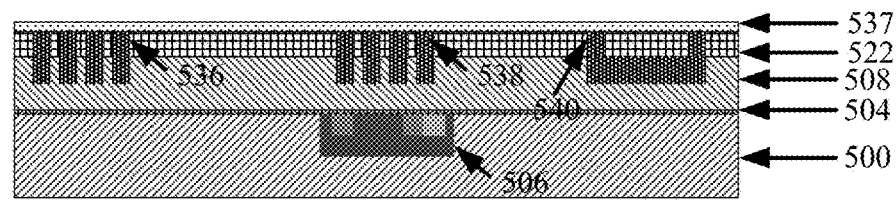
Figure 5I:
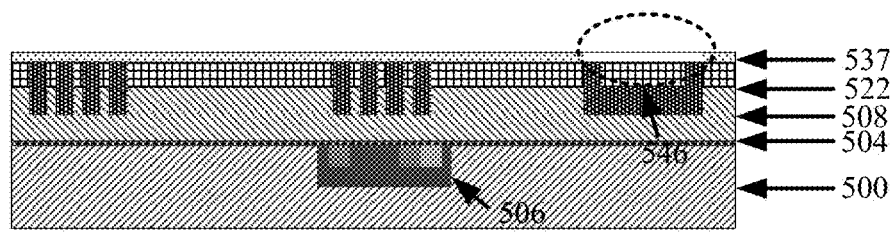
Figure 5J:
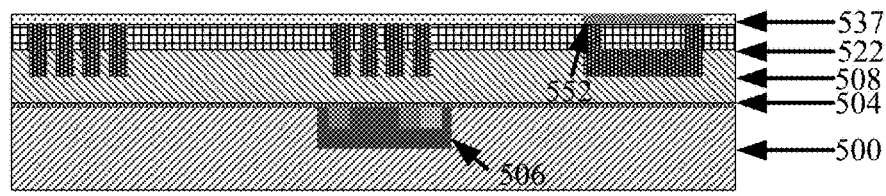

In FIG. 5H, a fourth resist layer 537 is disposed over the third resist layer 522 and conductive material 536-540. The fourth resist layer 537 is then patterned in FIG. 5I for forming a dielectric strap which will support a center conductor (e.g., center conductor 122 of FIG. 1) within the ground structure (e.g., ground structure 120 of FIG. 1) of the transition portion. Therefore, pattern 546 is then filled with a non-conductive material 552 as shown in FIG. 5J.

Figure 5K:
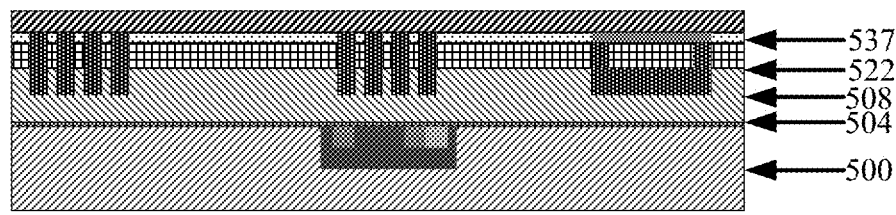
Figure 5L:
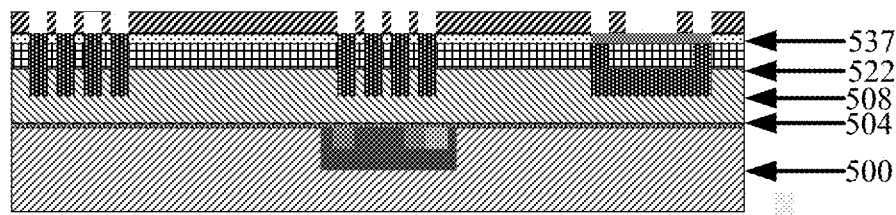
Figure 5M:
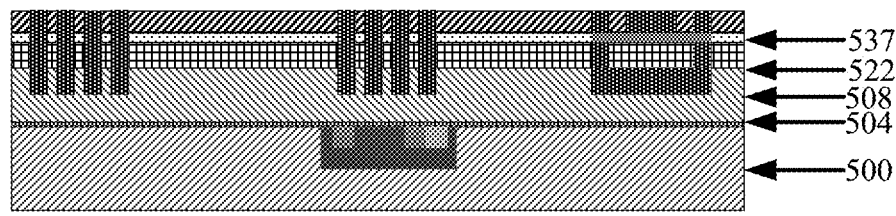
Figure 5N:
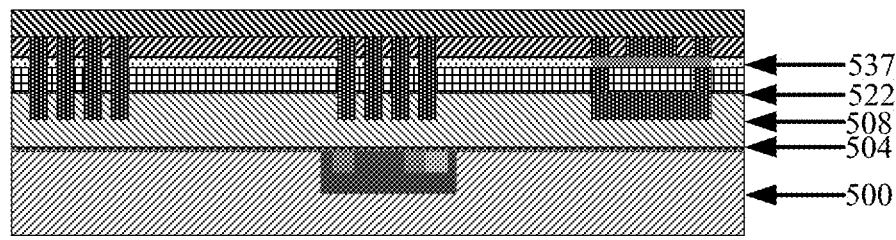
Figure 5O:
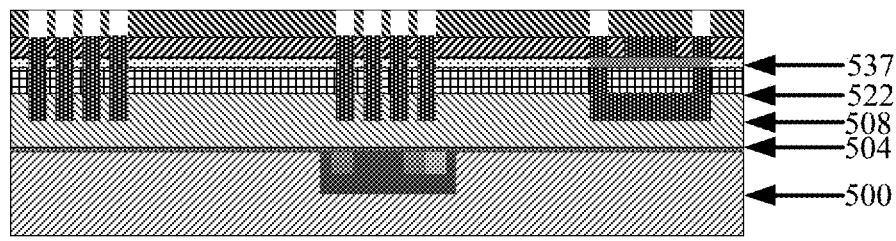
Figure 5P:
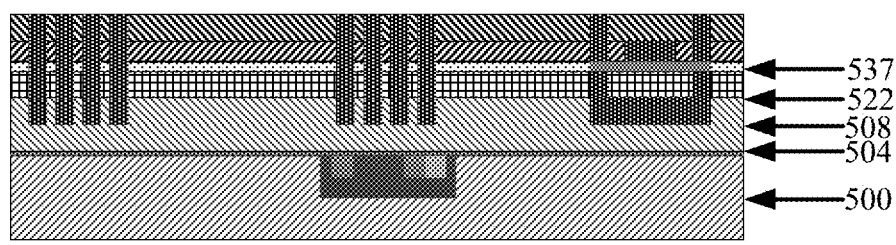
Figure 5Q:
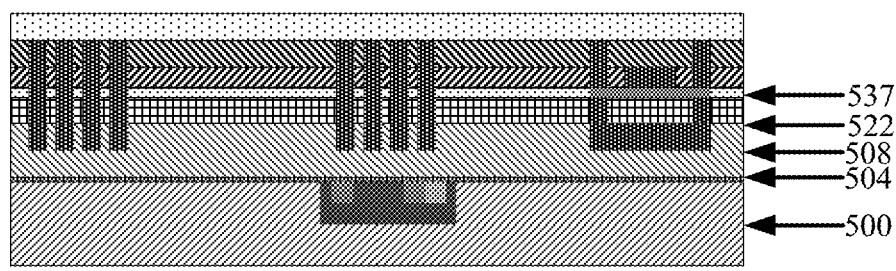
Figure 5R:
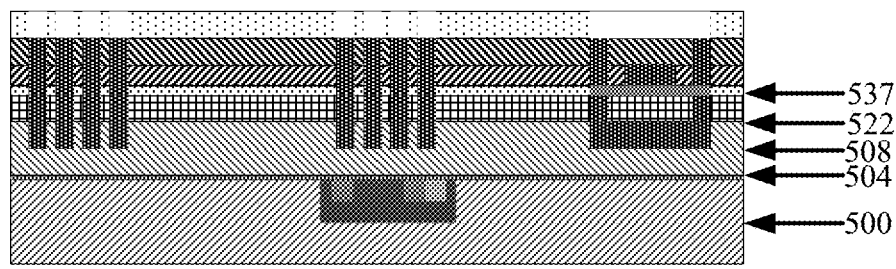
Figure 5S:
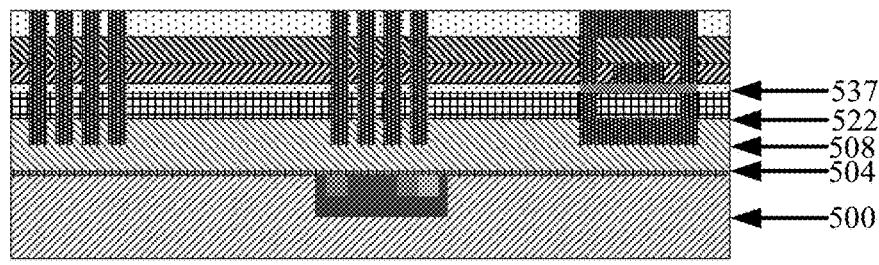
Figure 5T:
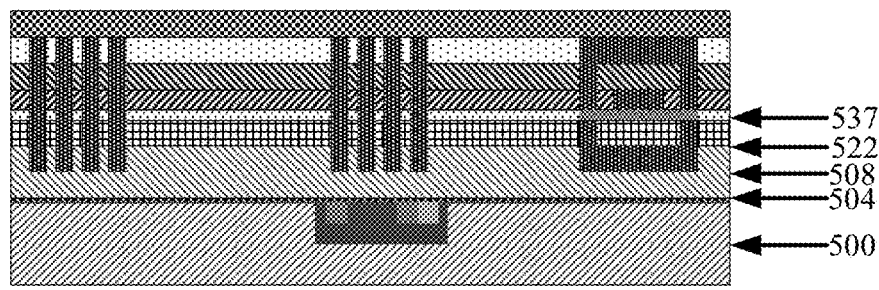
Figure 5U:
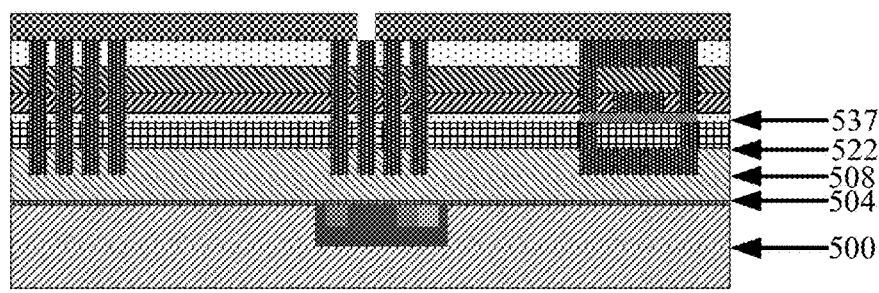
Figure 5V:
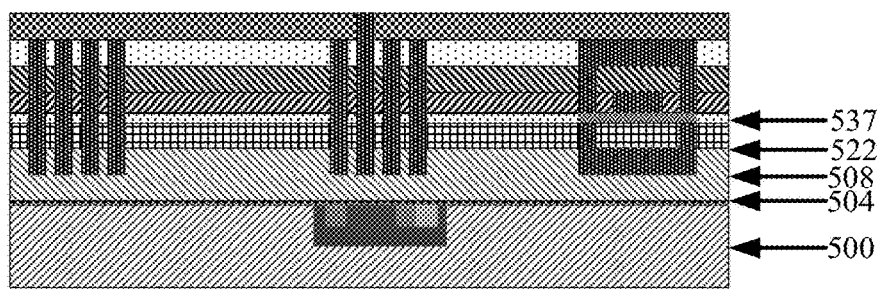
Figure 5W:
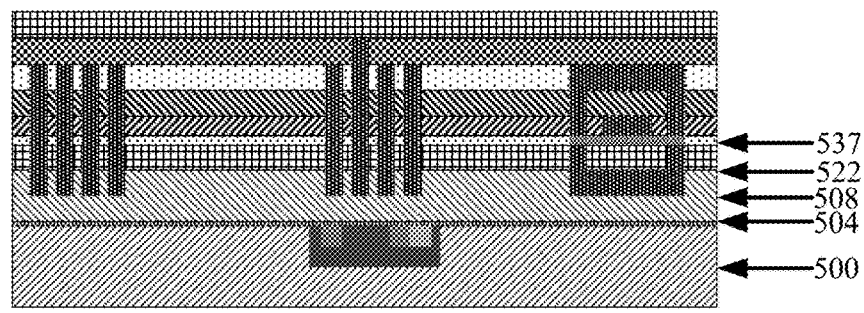
Figure 5X:
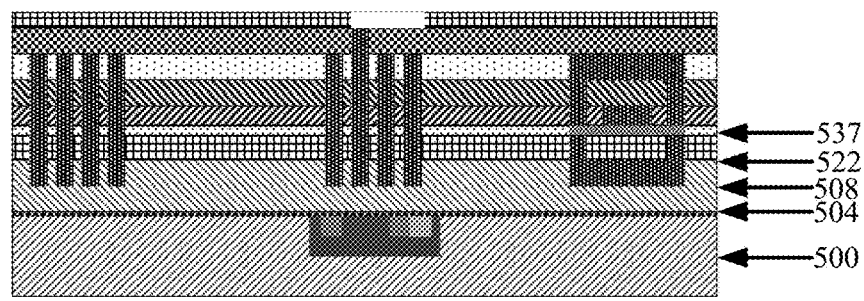
Figure 5Y:
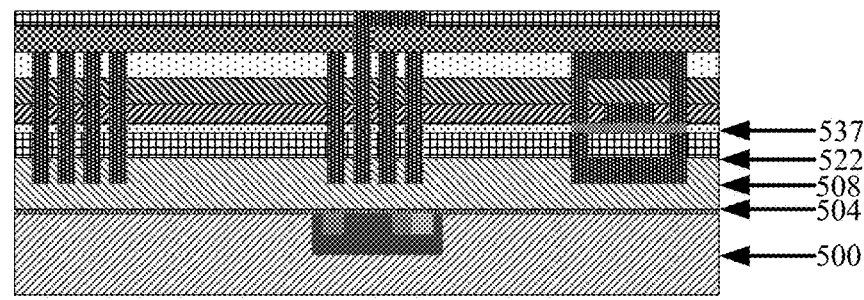
Figure 5Z:
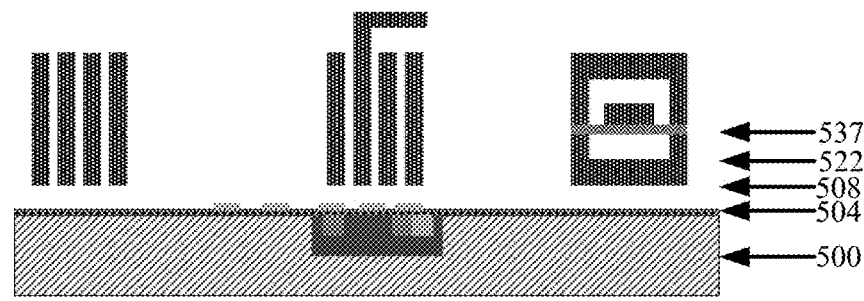

This process of disposing, patterning and filling of resists layers is repeated as shown in FIGS. 5K-5Y until the RF filter structure of FIG. 5Y is formed. Subsequently, the resist layers are removed as shown in FIG. 5Z. As a result of removing the resists layers, the RF filter structure is suspended over the substrate 500. The RF filter is electrically isolated from the circuitry 502 via air. A schematic illustration of an exemplary RF filter suspended over a substrate is shown in FIG. 2 which was discussed above.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

I claim:

1. A method for making an integrated Microelectromechanical Systems ("MEMS") device, comprising:
    forming first electronic circuitry on a major surface of a substrate;
    forming a MEMS filter structure on the major surface of the substrate;
    removing at least one first resist layer from the MEMS filter structure to form (a) a MEMS filter device suspended over the major surface of the substrate exclusively by a transition portion electrically connecting the MEMS filter device to the first electronic circuitry, and (b) a gas gap between the MEMS filter device and the major surface of the substrate; and
    removing at least one second resist layer from the MEMS filter structure such that the transition portion is defined by a three dimensional hollow ground structure in which an elongate center conductor is suspended and enclosed except for at one or more points of connection between the center conductor and the MEMS filter device;
    wherein at least a portion of the MEMS filter structure resides external to the three dimensional hollow ground structure of the transition portion, and the three dimensional hollow ground structure comprises at least one elongate linear portion extending between the first electronic circuitry and the MEMS filter.

2. The method according to claim 1, further comprising forming second electronic circuitry on the substrate so as to reside between the substrate and the MEMS filter device, wherein a gas gap exists between the second electronic circuitry and the MEMS filter device.

3. The method according to claim 2, wherein the second electronic circuitry is formed using a first conductive material having a first melting point, and the MEMS filter device is formed using a second conductive material having a second melting point that is different from the first melting point by no more than 100° C.

4. The method according to claim 1, further comprising connecting a dielectric strap between two opposing sidewalls of the transition portion whereby the elongate center conductor can be suspended within the three dimensional hollow ground structure.

5. The method according to claim 1, further comprising providing a gas gap between the elongate center conductor and the three dimensional hollow ground structure.

6. The method according to claim 1, further comprising electrically isolating at least two adjacent electronic elements of an RF MEMS filter device from each other using two spaced apart sidewalls of the ground structure of the transition portion.

7. The method according to claim 1, further comprising electrically isolating at least two adjacent electronic elements of an RF MEMS filter device from each other using a common sidewall of the ground structure of the transition portion.

8. A method for making an integrated Microelectromechanical Systems ("MEMS") device, comprising:

forming first electronic circuitry on a major surface of a substrate;

forming a MEMS filter structure on the major surface of the substrate;

removing at least one first resist layer from the MEMS filter structure to form (a) a MEMS filter device suspended over the major surface of the substrate exclusively by a transition portion electrically connecting the MEMS filter device to the first electronic circuitry, and (b) a gas gap between the MEMS filter device and the major surface of the substrate;

removing at least one second resist layer from the MEMS filter structure such that the transition portion is defined by a three dimensional hollow ground structure in which an elongate center conductor is suspended; and electrically isolating at least two adjacent electronic elements of an RF MEMS filter device from each other using a common sidewall of the ground structure of the transition portion;

wherein the common sidewall has a thickness that is greater than at least one other second adjoining sidewall of the ground structure.

* * * * *